(12) United States Patent
Lin (10) Patent No.: US 7,339,391 B2
(45) Date of Patent: Mar. 4, 2008

(54) DEFECT DETECTION METHOD

(75) Inventor: Kun Lin, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 424 days.

(21) Appl. No.: 10/908,828

(22) Filed: May 27, 2005

(65) Prior Publication Data

US 2006/0270067 A1 Nov. 30, 2006

(51) Int. Cl.
*G01R 31/26* (2006.01)

(52) U.S. Cl. ...................................... 324/765

(58) Field of Classification Search ......... 324/750–765
See application file for complete search history.

(56) References Cited

U.S. PATENT DOCUMENTS 5,804,980 A * 9/1998 Nikawa ....................... 324/752
6,405,359 B1 * 6/2002 Tseng et al. ................. 716/21
6,559,670 B1 * 5/2003 Motamedi ................... 324/765
6,686,757 B1 * 2/2004 Ring et al. .................. 324/765
7,079,966 B2 * 7/2006 Knoch et al. ................ 702/81
2003/0095699 A1 * 5/2003 Hung et al. ................. 382/149

* cited by examiner

*Primary Examiner*—Ha Tran Nguyen
*Assistant Examiner*—Joshua Benitez
(74) *Attorney, Agent, or Firm*—Winston Hsu (57) ABSTRACT

A defect detection method is disclosed, in which the method includes: providing a semiconductor sample, wherein the semiconductor sample comprises at least one defect; utilizing a failure analysis for detecting at least one suspected area on the backside of the semiconductor sample; utilizing a physical energy for forming a plurality of reference marks around the suspected area on the backside of the semiconductor sample; and utilizing the reference marks for determining the relative location of the defect on the front side of the semiconductor sample.

10 Claims, 7 Drawing Sheets

DEFECT DETECTION METHOD

BACKGROUND OF INVENTION

1. Field of the Invention

The present invention relates to a defect detection method, and more particularly, to a method of detecting defects on the backside of a semiconductor sample.

2. Description of the Prior Art

In the semiconductor fabricating process, some small particles and defects are unavoidable. As the size of devices shrinks and the integration of circuits increases gradually, those small particles or defects have an even greater effect on the properties of the integrated circuits. In order to improve the reliability of semiconductor devices, a plurality of tests and failure analyses are performed continuously to find the root cause of the defects or particles. Then, process parameters can be tuned correspondingly to reduce a presence of defects or particles so as to improve the yield and reliability of the semiconductor fabricating process.

Figure 1:
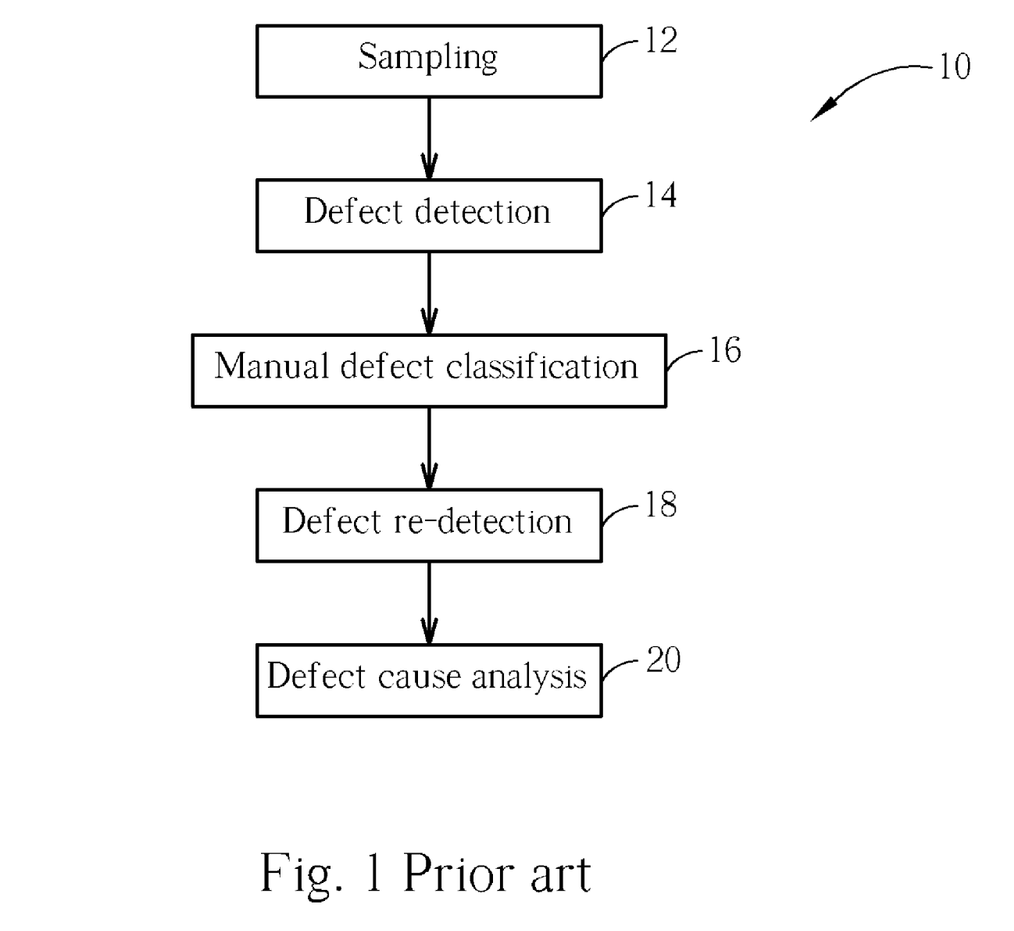
FIG. 1 is a schematic diagram of a defect detection method according to the prior art.

Please refer to FIG. 1. FIG. 1 is a schematic diagram of a method of defect detection 10 according to the prior art. As shown in FIG. 1, a sampling 12 is first performed to select a semiconductor wafer as a sample for following defect detection and analysis in advance. Next, a defect inspection 14 is performed. Normally, a proper defect inspection machine is utilized to scan in a large scale to detect all defects on the semiconductor wafer. Since there are too many defects on a semiconductor wafer, a manual defect review with the SEM cannot be directly performed for all defects in practice. Hence, a manual defect classification 16 is typically performed before the defect review 18. After separating the defects into different defect types, some defects are sampled for the defect review 18. Next, a defect root cause analysis 20 may be performed in advance according to the result of the defect review 18 to attempt to reduce the defect generation.

In the prior art technology, the biggest problem lies in the determination of defects from the samples. Typically, there may be thousands of defects found in the defect inspection 14. However, engineers are only able to pick a portion of the defects, such as 50 to 100, to perform the defect review 18 and the following defect analysis. In general, the determination of the killer defects, which often have a large impact on the yield of fabrication processes, is totally dependent upon the personal experience of the engineers and most of the time, the engineers are only able to randomly pick up some samples for the defect review 18. Thus, in most cases, since the samples in the defect review 18 are picked up randomly, it is obvious that only a few effective samples are valid and most parts of the defect review 18 are meaningless and ultimately, this leads to a huge waste of time and effort, and a great reduction in the accuracy of the following defect analysis.

In addition to most defects that are located on the surface of the semiconductor wafer, which can be analyzed by a front side approach to perform a failure analysis, some defects strongly related to fabrication processes are located on the bottom layer or backside of the wafer and normally, defects that are hidden within the wafer are the most difficult to detect, especially for chips with multi-layer metal wires. Hence, a backside approach referred to as the layout navigation system has been recently introduced to perform a much more accurate failure analysis for determining the location of the defect. Nevertheless, circuit layout diagrams needed for the layout navigation system are highly confidential materials for most companies and are difficult to obtain. Consequently, the difficulty of obtaining the circuit layout diagrams often increases fabrication time and cost, and influences the reliability, electrical performance, yield, and overall production when the fabs are performing defect analysis. Therefore, there has been a strong demand for developing a defect detection method for solving the above-mentioned problems.

SUMMARY OF INVENTION

It is therefore an objective of the present invention to provide a defect detection method to improve the time and cost of utilizing the conventional layout navigation system for performing defect detection on the backside of the semiconductor sample.

According to the present invention, a defect detection method includes the following steps: providing a semiconductor sample, wherein the semiconductor sample comprises at least one defect; utilizing a failure analysis for detecting at least one suspected area on the backside of the semiconductor sample; utilizing a physical energy for forming a plurality of reference marks around the suspected area on the backside of the semiconductor sample; and utilizing the reference marks for determining the relative location of the defect on the front side of the semiconductor sample.

According to the present invention, another defect detection method is disclosed, in which the method includes: providing a semiconductor sample, wherein the semiconductor sample comprises at least one defect; utilizing a failure analysis for detecting at least one suspected area on the backside of the semiconductor sample; utilizing a first physical energy for forming a plurality of first reference marks around the suspected area on the backside of the semiconductor sample; and utilizing a second physical energy and the first reference marks to form a plurality of second reference marks on the front side of the semiconductor sample for determining the relative location of the defect.

According to the present invention, another defect detection method is disclosed, in which the method includes: providing a semiconductor sample, wherein the semiconductor sample comprises at least one defect; utilizing a failure analysis for detecting at least one suspected area on the backside of the semiconductor sample; utilizing a physical energy for forming a plurality of reference marks around the suspected area on the backside of the semiconductor sample; and utilizing abnormal voltage contrast results and the reference marks for determining the relative location of the defect on the front side of the semiconductor sample.

In contrast to the conventional defect detection method, the present invention utilizes a first utilizes a failure analysis to determine the location of a suspected area on the backside of the semiconductor sample and after locating a physical energy damage signal, utilizes a non-contact physical energy to form a plurality of destructive reference marks around the suspected area on the backside of the semiconductor sample for marking the location of the defect, thereby greatly improving the difficulty, cost, and time of utilizing the conventional layout navigation system for performing defect detection on the backside of the semiconductor sample.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
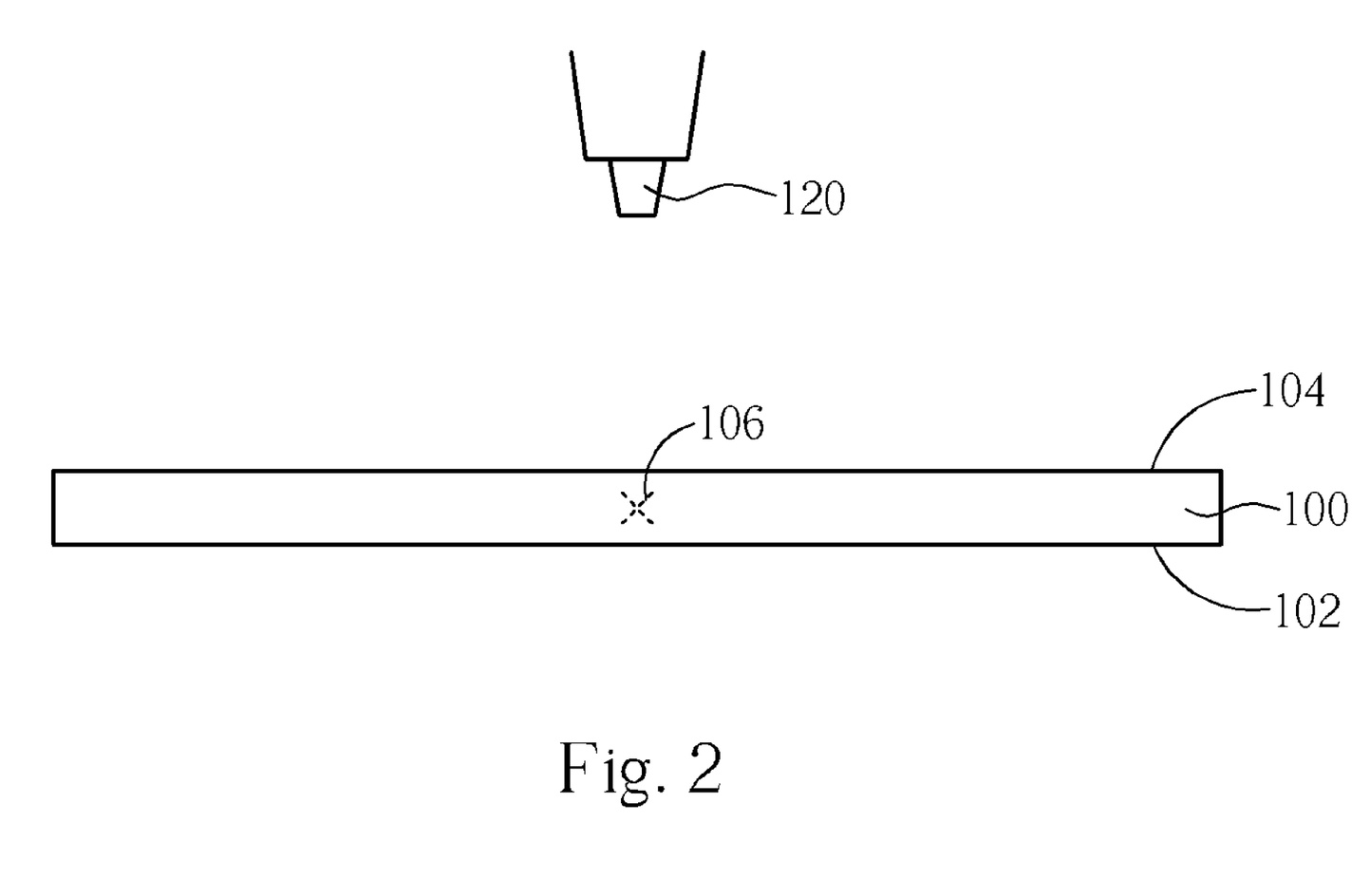
FIG. 2 is a perspective diagram showing the means of examining a defect on the backside of the semiconductor sample.

Please refer to FIG. 2. FIG. 2 is a perspective diagram showing the means of examining a defect on the backside of a semiconductor sample 100. As shown in FIG. 2, a semiconductor sample 100 is first provided, in which the semiconductor sample 100 can be a semiconductor wafer, die, or chip according to different stage of the fabrication process. Preferably, a semiconductor wafer is utilized as an example in the present invention. The semiconductor sample 100 includes a front side 102 and a backside 104, and at least a defect 106 or a suspected spot. The defect 106 or the suspected spot can be detected by utilizing a failure analysis technique, such as a hot spot analysis, IR OBIRCH analysis, or emission analysis to track a suspected signal produced on the backside 104 of the semiconductor sample 100 and finally locate the location of a suspected area.

In an example of utilizing a photo-emission microscope to perform an OBIRCH analysis, a laser is first provided to scan the backside 104 of the semiconductor sample 100. During the scanning process, a portion of the laser energy is converted to heat energy and if any defect or hole is present on the semiconductor sample 100, the heat transfer of the area around the defect will become different than other areas of the same sample, thereby causing partial temperature transformation and forming abnormal signals. Additionally, a constant voltage can be utilized to connect to two ends of the semiconductor sample 100 and by relating the variation of the electrical current provided by the constant voltage with the pixel intensity of the image formed and relating the location of the pixel with the location scanned by the laser beam during an electrical current variation, the location of the defect can be determined. Consequently, the present invention is able to determine the location of the defect within a circuit and effectively examine problems such as short circuit or electrical leakage.

Next, a non-contact physical energy is utilized to form a plurality of destructive reference marks 122 around the suspected area on the backside 104 of the semiconductor sample 100. In other words, by utilizing the failure analysis such as the hot spot analysis, IR OBIRCH analysis, and emission analysis to first determine the location of the suspected area on the backside 104 of the semiconductor sample 100 and locating a physical energy damage signal, a laser emission device 120 is then utilized to form a plurality of reference marks 122 around the defect 106 on the backside 104 of the semiconductor sample 100 for determining the location of the defect 106.

Figure 3:
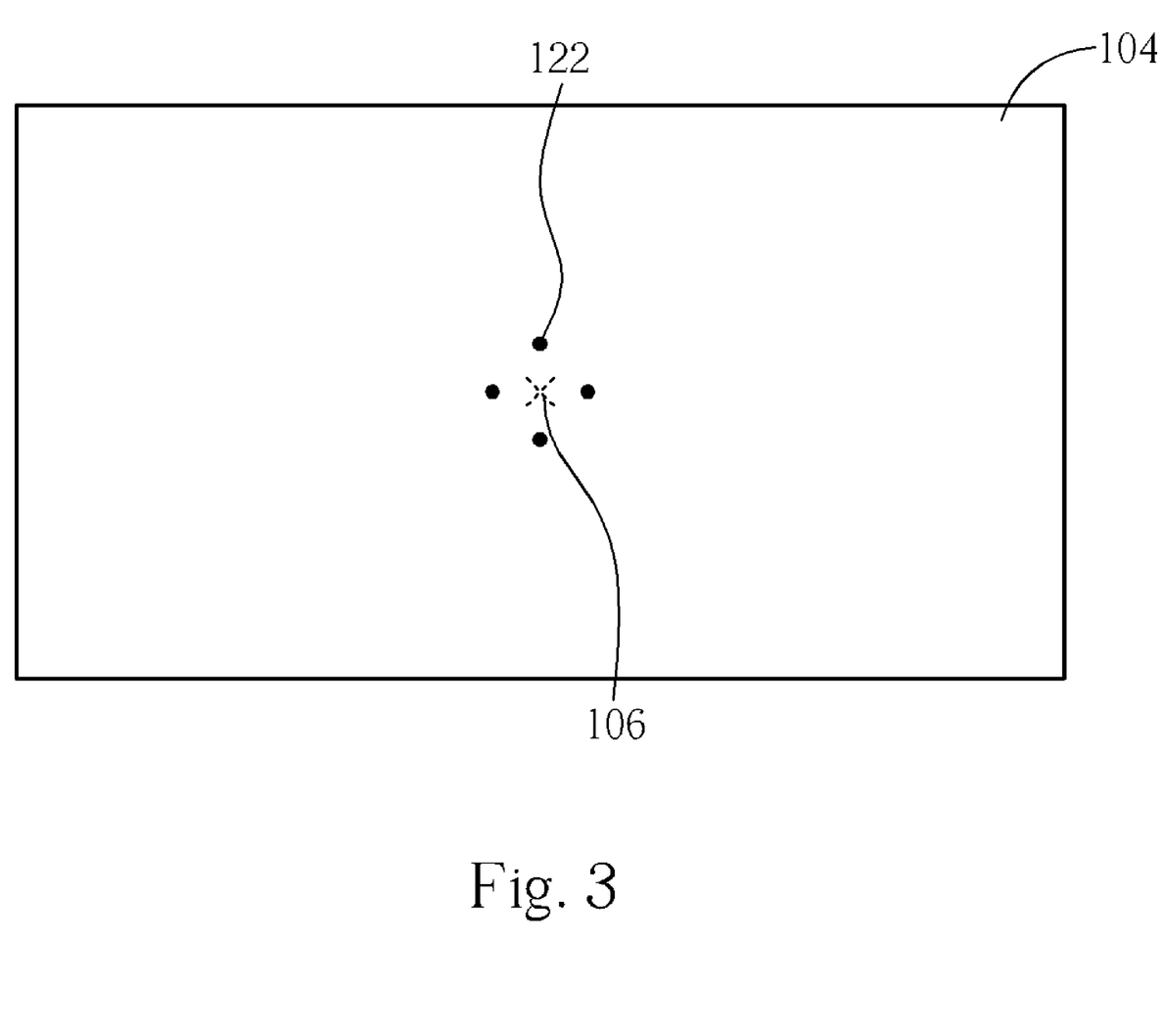
FIG. 3 is a perspective diagram showing the upward view of the front side of the semiconductor sample according to the first embodiment of the present invention.

Preferably, the reference marks 122 formed around the defect 106 on the backside 104 of the semiconductor sample 100 are observed from the front side 102 of the semiconductor sample 100. Please refer to FIG. 3. FIG. 3 is a perspective diagram showing the upward view of the front side 102 of the semiconductor sample 100 according to the first embodiment of the present invention. In general, the thickness of a semiconductor wafer is roughly between 9000 angstroms (Å) to 14000 angstroms and in order to accurately determine the location of the reference marks 122 on the front side 102 of the semiconductor sample 100, users are able to adjust the strength of the laser beam source for forming a plurality of destructive reference marks 122 on the backside 104 of the semiconductor sample 100 and then observe the reference marks 122 from the front side 102 of the semiconductor sample 100.

Next, an optical microscope, scanning electron microscope (SEM), transmission electron microscope (TEM), or focused ion beam (FIB) microscope is utilized to examine the front side 102 of the semiconductor sample 100. According to different circumstances, a physical (such as a plasma etching process) or chemical (such as solutions) approach is utilized to perform a delayer process for determining the location and cause of the defect 106.

Figure 4:
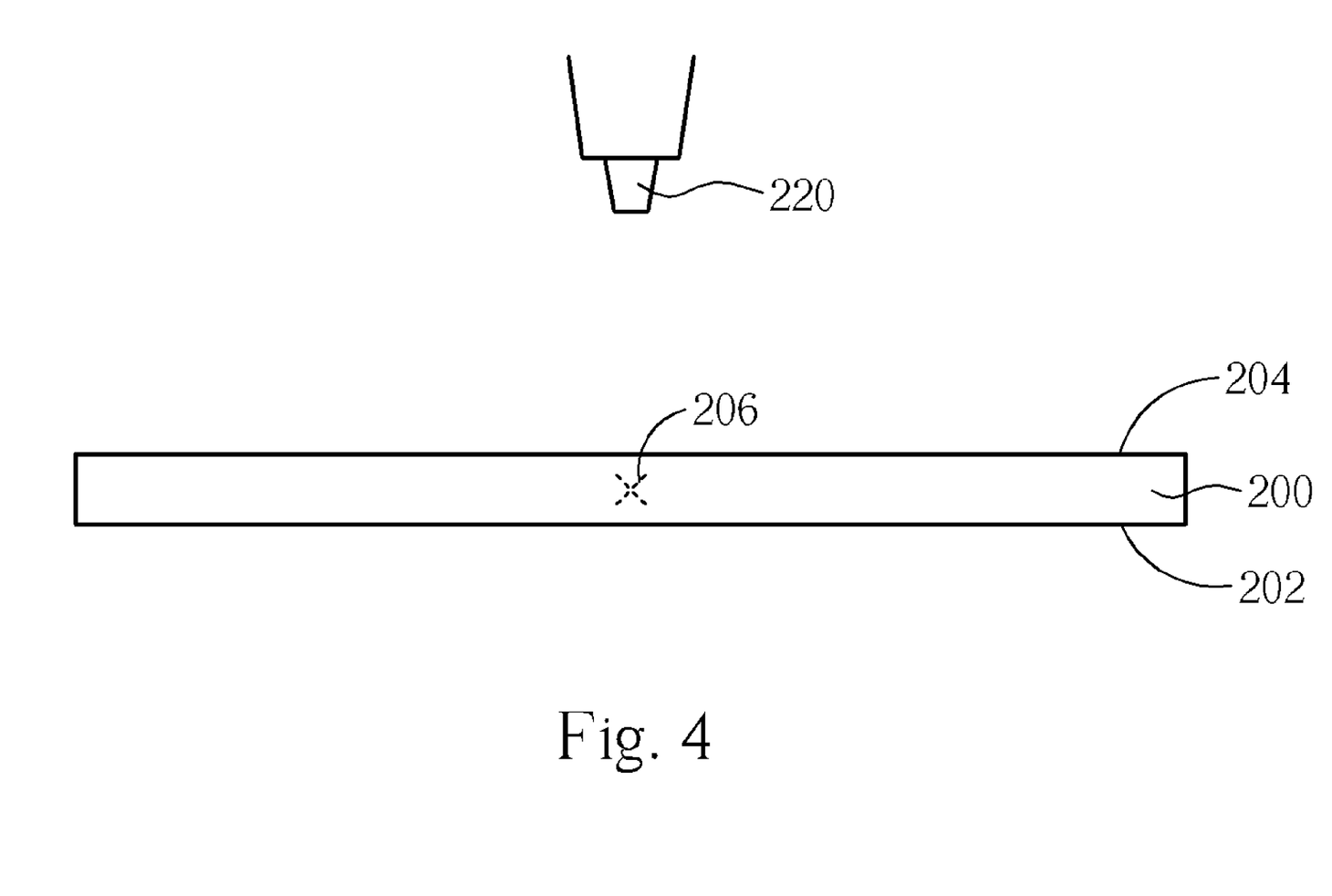
FIG. 4 through FIG. 6 are perspective diagrams showing the means of examining the defect on both backside and front side of a semiconductor sample.
Figure 5:
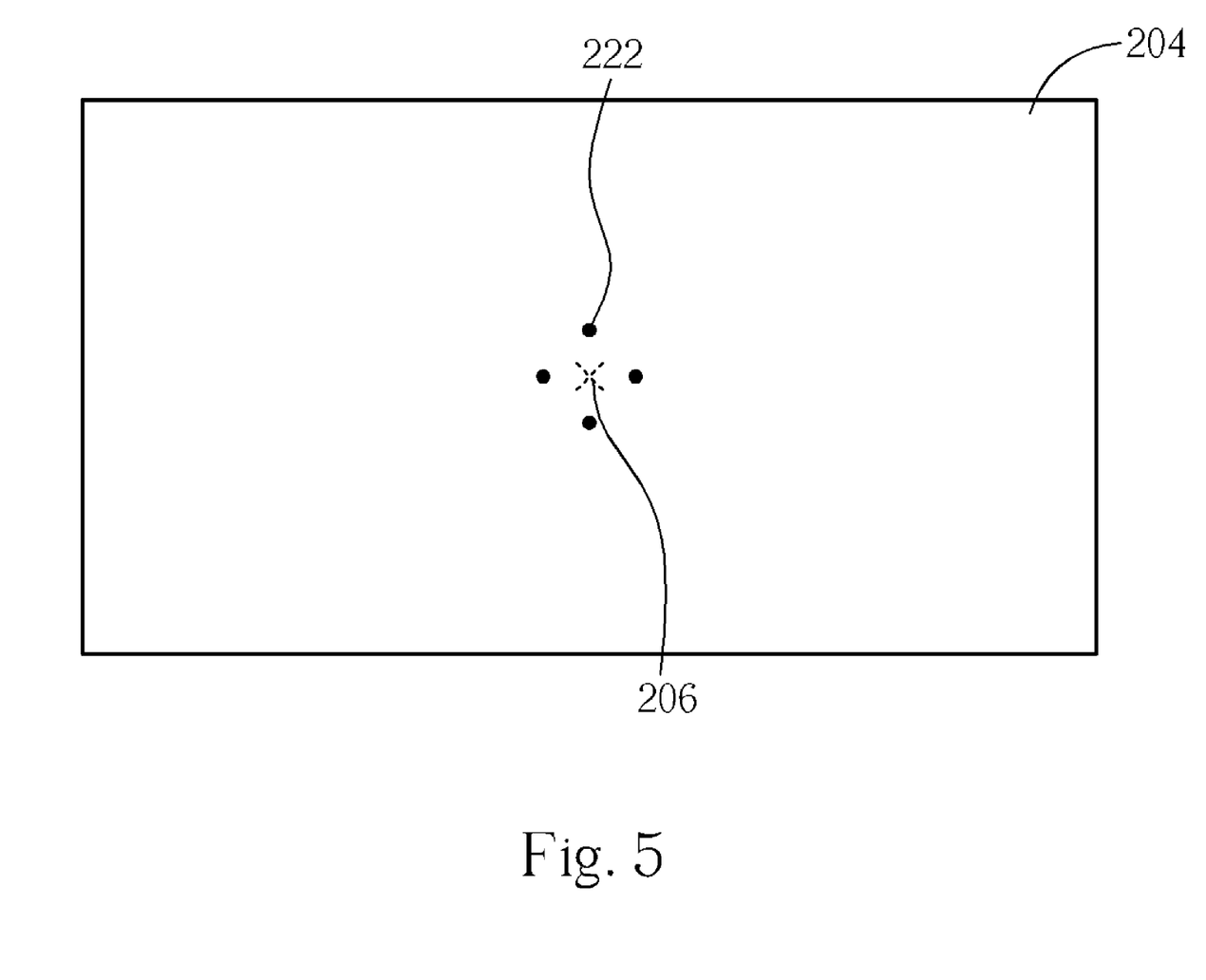
Figure 6:
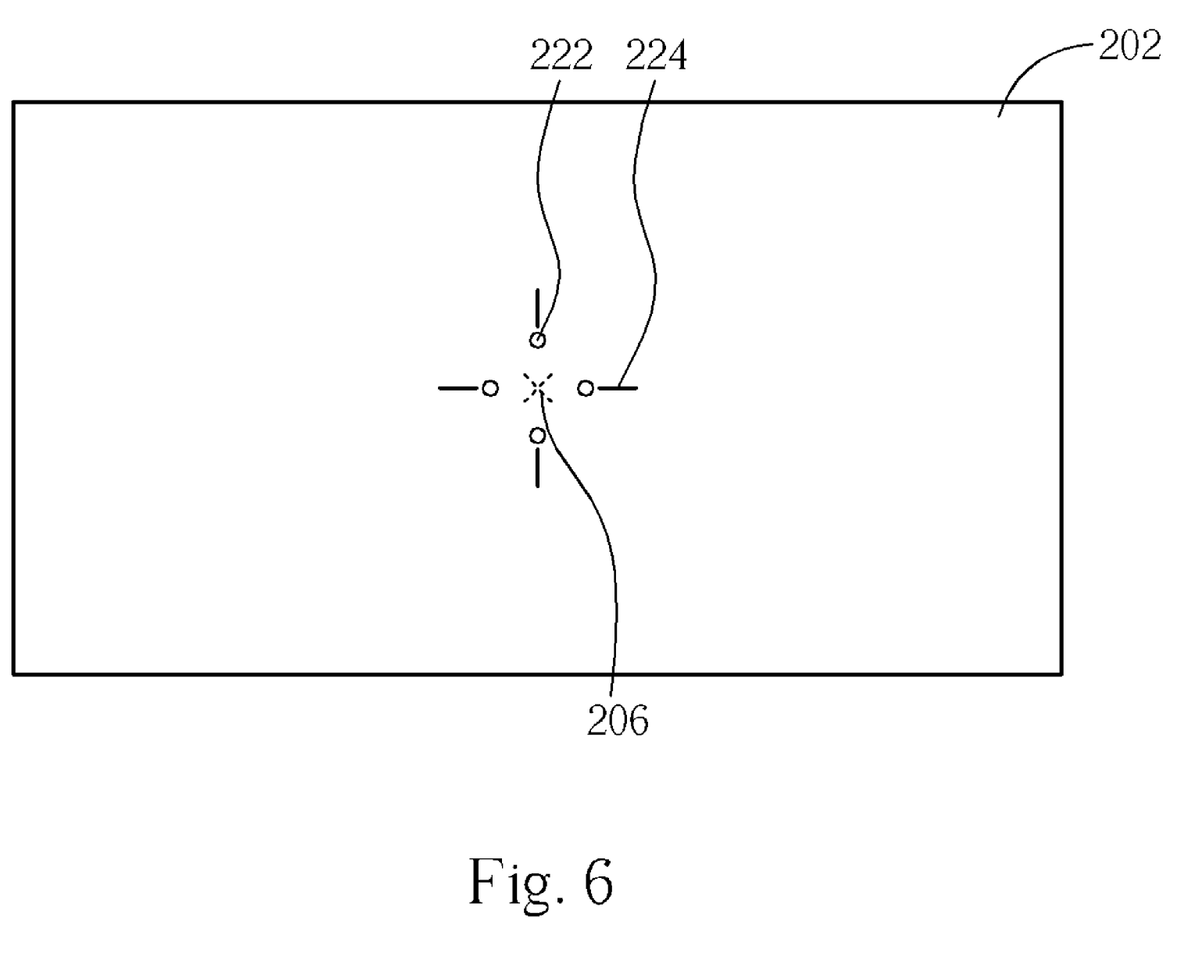

According to another embodiment of the present invention, a non-contact physical energy can also be utilized to form a plurality of destructive reference marks on both the front and back sides of a semiconductor sample for determining the location of the defect. Please refer to FIG. 4 through FIG. 6. FIG. 4 through FIG. 6 are perspective diagrams showing the means of examining the defect on both the backside and front side of the semiconductor sample 200.

Similar to the first embodiment, a semiconductor sample 200 is provided, in which the semiconductor sample 200 includes a front side 202, a backside 204, and at least one defect 206 or a suspected spot. Next, a failure analysis, such as a hot spot analysis, IR OBIRCH analysis, or emission analysis is utilized to determine the location of the suspected area on the backside 204 of the semiconductor sample 200 and after locating the physical energy damage signal, a laser emission device 220 is utilized to form a plurality of reference marks 222 around the defect 206 on the backside 204 for marking the location of the defect 206, as shown in FIG. 5. Next, the laser emission device 220 is utilized again for forming a plurality of reference marks 224 on the front side 202 of the semiconductor sample 200. Preferably, this procedure can be performed repeatedly until the reference marks 224 on the front side 202 approach the reference marks 222 on the backside 222 and the reference marks 222 and 224 finally overlap each other, as shown in FIG. 6.

Next, an optical microscope, scanning electron microscope (SEM), transmission electron microscope (TEM), or focused ion beam (FIB) microscope is utilized to examine the front side 202 of the semiconductor sample 200 and according to different circumstances, and a physical or chemical delayer process is then utilized for determining the location and cause of the defect 206.

Figure 7:
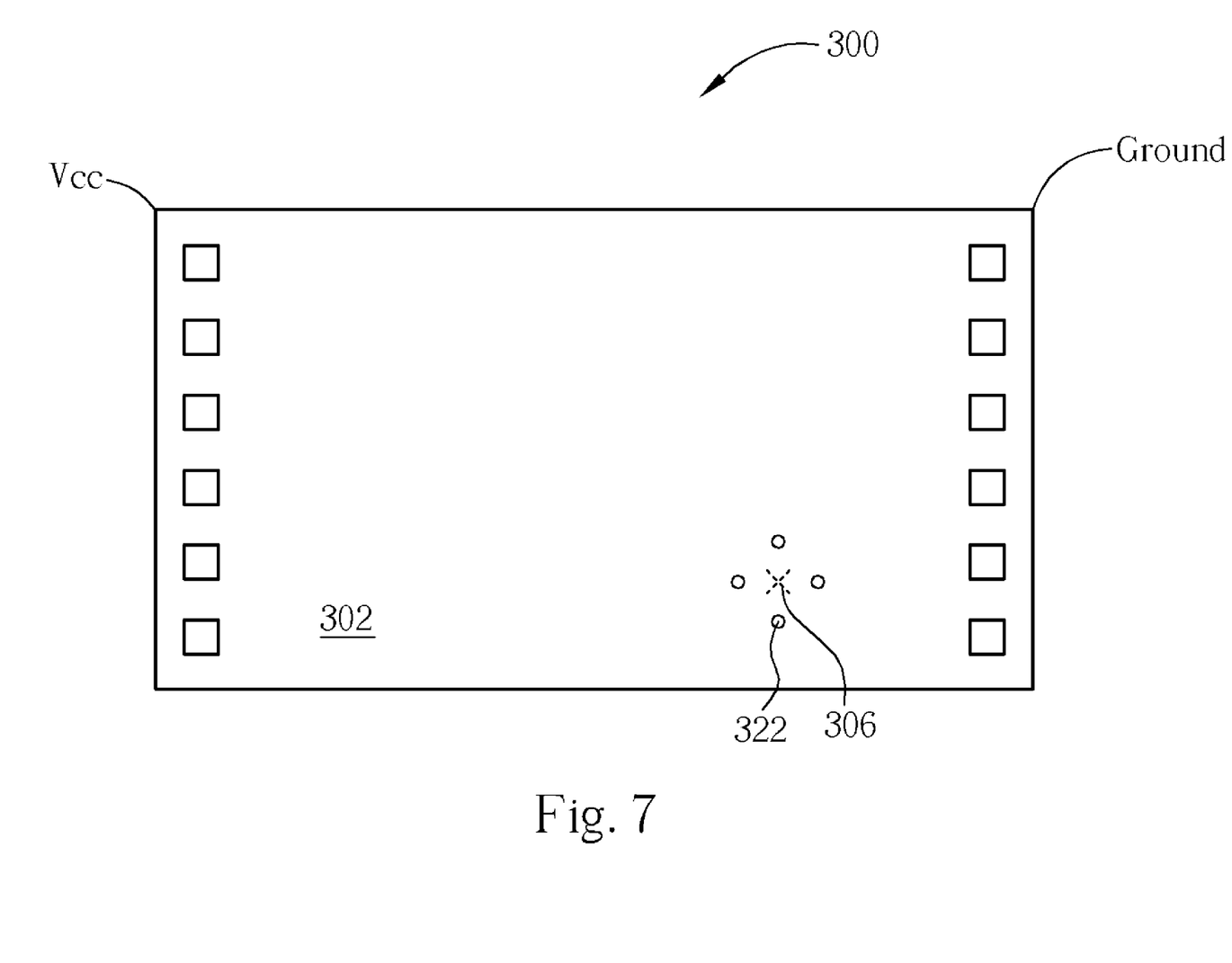
FIG. 7 is a perspective diagram showing the means of examining the defect on the front side of the semiconductor sample according to another embodiment of the present invention.

Additionally, the present invention also utilizes a constant voltage to connect to a semiconductor sample and determine the location of the defect on the front side of the semiconductor sample by observing the electrical current change generated by the voltage. Please refer to FIG. 7. FIG. 7 is a perspective diagram showing the means of examining the defect on the front side of the semiconductor sample. First, a semiconductor sample 300 is provided, in which the semiconductor sample 300 includes a front side 302, a backside (not shown), and at least one defect 306 or a suspected spot. Next, a failure analysis technique, such as a hot spot analysis, IR OBIRCH analysis, or emission analysis is utilized to determine the location of the suspected area on the backside of the semiconductor sample 300, and after locating the physical energy damage signal relating to the suspected area, a laser emission device (not shown) is utilized to form a plurality of reference marks 322 around the defect 306 on the backside of the semiconductor sample 300.

Next, a constant voltage is provided to form a plurality of electrical currents for connecting to two ends of the semiconductor sample 300, in which one end of the semiconductor sample 300 is connected to a voltage source $V_{CC}$ whereas the other end is connected to ground. When the laser emission device is utilized, a portion of the laser energy will be transformed into heat energy and if a defect is present on the semiconductor sample, the heat transfer around the defect will be different from other areas without the defect, thereby causing partial temperature change and forming a plurality of destructive reference marks. Hence after the destructive reference marks are formed, the constant voltage can be utilized to connect to the semiconductor sample 300, and by obtaining abnormal voltage contrast results of the area in proximity to the defect 306, the location of the defect 306 can be determined from the front side 302 of the semiconductor sample 300.

In contrast to the conventional method of detecting defects within a semiconductor sample, the present invention first utilizes a failure analysis to determine the location of a suspected area on the backside of the semiconductor sample and after locating a physical energy damage signal, a non-contact physical energy is utilized to form a plurality of destructive reference marks around the suspected area on the backside of the semiconductor sample for marking the location of the defect. Next, approaches including laser markings or measuring abnormal voltage contrast results can be utilized to form a plurality of corresponding reference marks on the front side of the semiconductor sample or to emphasize the location of the defect. Finally, an optical microscope, scanning electron microscope, transmission electron microscope, or focused ion beam microscope is utilized in coordination with physical or chemical delayer processes to examine the front side of the semiconductor sample and analyze the location and cause of the defect. As a result, the present invention is able to greatly reduce the difficulty, cost, and time of utilizing the conventional layout navigation system for performing defect detection on the backside of the semiconductor sample.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A defect detection method comprising:
    providing a semiconductor sample, wherein the semiconductor sample comprises at least one defect;
    utilizing a failure analysis for detecting at least one suspected area on one first surface of the semiconductor sample;
    utilizing at least one first physical energy for forming a plurality of reference marks around the suspected area on the first surface of the semiconductor sample; and
    utilizing the reference marks for determining the relative location of the defect on one second surface of the semiconductor sample.

2. The defect detection method of claim 1, wherein the semiconductor sample comprises a semiconductor wafer, die, or chip.

3. The defect detection method of claim 1, wherein the failure analysis comprises a hot spot analysis, an IR OBIRCH analysis, or an emission analysis.

4. The defect detection method of claim 3, wherein the failure analysis generates a suspected signal respective to the location of the defect on the first surface of the semiconductor sample for further determining the location of the suspected area.

5. The defect detection method of claim 1, wherein the first physical energy is a laser beam.

6. The defect detection method of claim 1, wherein the step of determining the relative location of the defect on the second surface of the semiconductor sample is achieved by calculating abnormal voltage contrast results.

7. The defect detection method of claim 1, wherein the step of determining the relative location of the defect on the second surface of the semiconductor sample is achieved by utilizing a laser beam.

8. The defect detection method of claim 1, wherein after the step of determining the relative location of the defect on the second surface of the semiconductor sample is completed, the method further comprises an examining step.

9. The defect detection method of claim 8, wherein the examining step further comprises utilizing an optical microscope, a scanning electron microscope, a transmission electron microscope, or a focused ion beam microscope for examining the second surface of the semiconductor sample.

10. The defect detection method of claim 9, wherein the examining step further comprises a physical or chemical delayer process for determining the location of the defect.

* * * * *